United States Patent
Stopper et al.

(10) Patent No.: US 10,777,436 B2
(45) Date of Patent: Sep. 15, 2020

(54) HIGH SPEED ROTARY SORTER

(71) Applicant: Applied Materials, Inc., Santa Clara, CA (US)

(72) Inventors: Markus J. Stopper, Voerstetten (DE); Asaf Schlezinger, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 860 days.

(21) Appl. No.: 15/307,323

(22) PCT Filed: Apr. 5, 2016

(86) PCT No.: PCT/US2016/026035
§ 371 (c)(1),
(2) Date: Oct. 27, 2016

(87) PCT Pub. No.: WO2016/175989
PCT Pub. Date: Nov. 3, 2016

(65) Prior Publication Data
US 2017/0170041 A1 Jun. 15, 2017

Related U.S. Application Data

(60) Provisional application No. 62/154,521, filed on Apr. 29, 2015.

(51) Int. Cl.
*H01L 21/67* (2006.01)
*H01L 21/677* (2006.01)
(Continued)

(52) U.S. Cl.
CPC .. *H01L 21/67271* (2013.01); *H01L 21/67766* (2013.01); *H01L 21/6838* (2013.01);
(Continued)

(58) Field of Classification Search
CPC .......... H01L 21/67271; H01L 21/6838; H01L 21/67766
(Continued)

(56) References Cited

U.S. PATENT DOCUMENTS 4,653,231 A * 3/1987 Cronkhite ............. B24B 37/345
451/388
4,753,162 A 6/1988 Bubley
(Continued)

FOREIGN PATENT DOCUMENTS

| JP | H01-310553 A | 12/1989 |
| JP | H04-121334 A | 4/1992 |

(Continued)

OTHER PUBLICATIONS

Machine Translation of KR20130020103.*
(Continued)

*Primary Examiner* — Charles A Fox
*Assistant Examiner* — Michael E Butler
(74) *Attorney, Agent, or Firm* — Patterson + Sheridan, LLP

(57) ABSTRACT

Embodiments of the present disclosure generally relate to expandable substrate inspection systems. The inspection system includes multiple metrology units adapted to inspect, detect, or measure one or more characteristics of a substrate, including thickness, resistivity, saw marks, geometry, stains, chips, micro cracks, and crystal fraction. The inspection systems may be utilized to identify defects on substrates and estimate cell efficiency prior to processing a substrate. Substrates may be transferred through the inspection system and/or between metrology units on a track or conveyor, and then sorted via at least one gripper coupled with the high speed rotatory sorting apparatus into respective bins based upon the inspection data. The rotary sorting apparatus main-
(Continued)

tains a sorting capability of at least 5,400 substrates per hour. Each bin may optionally have a gas support cushion for supporting the substrate as it falls from the rotary sorting apparatus into the respective bin.

22 Claims, 5 Drawing Sheets

(51) Int. Cl.
H01L 21/683 (2006.01)
B07C 5/10 (2006.01)
B07C 5/342 (2006.01)
B07C 5/344 (2006.01)
G01B 11/00 (2006.01)
G01N 21/64 (2006.01)
G01N 21/95 (2006.01)
G01N 21/84 (2006.01)
H01L 21/66 (2006.01)

(52) U.S. Cl.
CPC .............. B07C 5/10 (2013.01); B07C 5/342 (2013.01); B07C 5/344 (2013.01); G01B 11/00 (2013.01); G01N 21/6489 (2013.01); G01N 21/9501 (2013.01); G01N 2021/845 (2013.01); H01L 21/67769 (2013.01); H01L 22/12 (2013.01)

(58) Field of Classification Search
USPC ........................................................ 209/552
See application file for complete search history.

(56) References Cited

U.S. PATENT DOCUMENTS

| | | | | |
|---|---|---|---|---|
| 4,776,744 A * | 10/1988 | Stonestreet | ....... | H01L 21/67775 269/254 R |
| 6,309,116 B1 | 10/2001 | Mahara et al. | | |
| 6,601,888 B2 * | 8/2003 | McIlwraith | .......... | B65G 47/911 294/64.3 |
| 10,092,929 B2 * | 10/2018 | Bonora | ..................... | B07C 5/00 |
| 2004/0109751 A1 | 6/2004 | Whitcomb et al. | | |
| 2008/0053794 A1 * | 3/2008 | Brain | ................... | B65G 37/005 198/626.1 |
| 2009/0081007 A1 * | 3/2009 | Tabrizi | .............. | H01L 21/67294 414/222.02 |
| 2013/0079913 A1 | 3/2013 | Oza et al. | | |
| 2013/0216348 A1 * | 8/2013 | Tan | ......................... | H01L 31/18 414/751.1 |
| 2014/0294544 A1 | 10/2014 | Rebstock | | |

FOREIGN PATENT DOCUMENTS

| | | |
|---|---|---|
| JP | H06048607 A | 2/1994 |
| JP | 2000353648 A | 12/2000 |
| JP | 2002075897 A | 3/2002 |
| JP | 2006186124 A | 7/2006 |
| JP | 201064024 A | 3/2010 |
| JP | 2010509785 A | 3/2010 |
| JP | 2012028551 A | 2/2012 |
| JP | 2014078559 A | 5/2014 |
| KR | 19990085867 | 12/1999 |
| KR | 20110095023 A | 8/2011 |
| KR | 20130020103 A | 2/2013 |

OTHER PUBLICATIONS

European Office Action for Application No. 1685079.1 dated Sep. 10, 2018.
Office Action from Korea Application No. 10-2016-7031005 dated Apr. 18, 2017.
International Search Report and Written Opinion dated Jun. 30, 2016, PCT/US2016/026035.
European Search Report for Application No. EP16785079.1 dated Nov. 14, 2017.
Japanese Office Action dated Jul. 2, 2018 for Application No. 2016-566640.
Japanese Office Action for Application No. 2016-566640 dated Dec. 18, 2017.
Notice of Allowance for Japanese Application No. 2016-566640 dated Apr. 4, 2019.

* cited by examiner

HIGH SPEED ROTARY SORTER

BACKGROUND

Field

Embodiments of the present disclosure generally relate to semiconductor inspection equipment. More specifically, embodiments disclosed herein relate to a system and method for the high speed sorting of substrates.

Description of the Related Art

Substrates, such as semiconductor substrates, are routinely inspected during processing at independent inspection stations to ensure compliance with predetermined quality control standards. Different inspection techniques provide comprehensive data regarding products and processes. However, comprehensive inspections can be time consuming, thus reducing throughput, due to the number of inspection stations needed and the resulting transfer time of moving substrates therebetween. Thus, device manufacturers are often faced with the decision of choosing between thorough inspections with burdensome inspection/transfer times, or foregoing certain inspection processes.

Typical sorting systems sort approximately 3,600 substrates per hour in a linear arrangement. However, as inspection processes have continued to decrease the amount of time to complete inspection steps, sorting apparatuses able to keep up with faster sortings are needed to increase throughput.

As the foregoing illustrates, there is a need for an improved substrate inspection system for sorting inspected substrates at increased speeds and allowing for higher throughputs. Therefore, what is needed in the art is a high speed rotary sorter.

SUMMARY

In one embodiment, an apparatus for inspecting and sorting a plurality of substrates is disclosed. The apparatus includes a rotatable support. The rotatable support is provided within a sorting unit and is configured for rotating about a rotational axis. A plurality of arms are coupled to the rotatable support and extend radially outward relative to the rotational axis. At least one gripper is coupled to each arm and positionable over a plurality of bins. Each bin is positioned within the sorting unit below a path along which the at least one gripper travels as the rotatable support rotates.

In another embodiment, an apparatus adapted to inspect and sort substrates is disclosed. The apparatus includes a loading unit, a metrology unit, a sorting unit, and a plurality of individually removable sorting bins. The metrology unit is coupled with the loading unit. The sorting unit is coupled with the metrology unit. The sorting unit includes a platform within the sorting unit, a plurality of arms, and at least one gripper. The platform is configured to rotate about a center axis of the platform. Each arm of the plurality of arms has a first end and a second end. The first end is coupled to the platform. Each arm of the plurality of arms further extends radially outward from the center axis of the platform. The at least one gripper is coupled to the second end of each of the plurality of arms. Each of the plurality of individually removable sorting bins are positioned within the sorting unit, below a path along which the at least one gripper travels as the at least one gripper rotates.

In yet another embodiment, a method of operating an apparatus for inspecting and sorting a plurality of substrates in an enclosure is disclosed. The method includes loading a substrate into a loading unit of the enclosure, transferring the substrate into a metrology unit of the enclosure, performing metrology on the substrate in the metrology unit, assigning the substrate to a sorting bin based on the metrology, and transferring the substrate to a sorting unit. Transferring the substrate may include holding the substrate with at least one gripper of the sorting module, rotating the substrate held by the at least one gripper about a center axis of the sorting unit to a desired location above the sorting bin assigned for the held substrate, and releasing the substrate from the at least one gripper into the assigned sorting bin.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to expandable substrate inspection systems. The inspection system includes multiple metrology units adapted to analyze one or more characteristics of a substrate, including, by way of example only, thickness, resistivity, saw marks, geometry, stains, chips, micro cracks, and crystal fraction. The inspection systems may be utilized to identify defects on substrates and estimate cell efficiency prior to processing a substrate. Substrates may be transferred through the inspection system and/or between metrology units on a track or conveyor system, and then sorted via at least one gripper coupled with the high speed rotatory sorting apparatus into respective bins based upon the inspection data. The sorting apparatus maintains a sorting capability of at least 5,400 substrates per hour. Each bin optionally has a gas support cushion for supporting the substrate as it falls from the rotary sorting apparatus into the respective bin.

Figure 1:
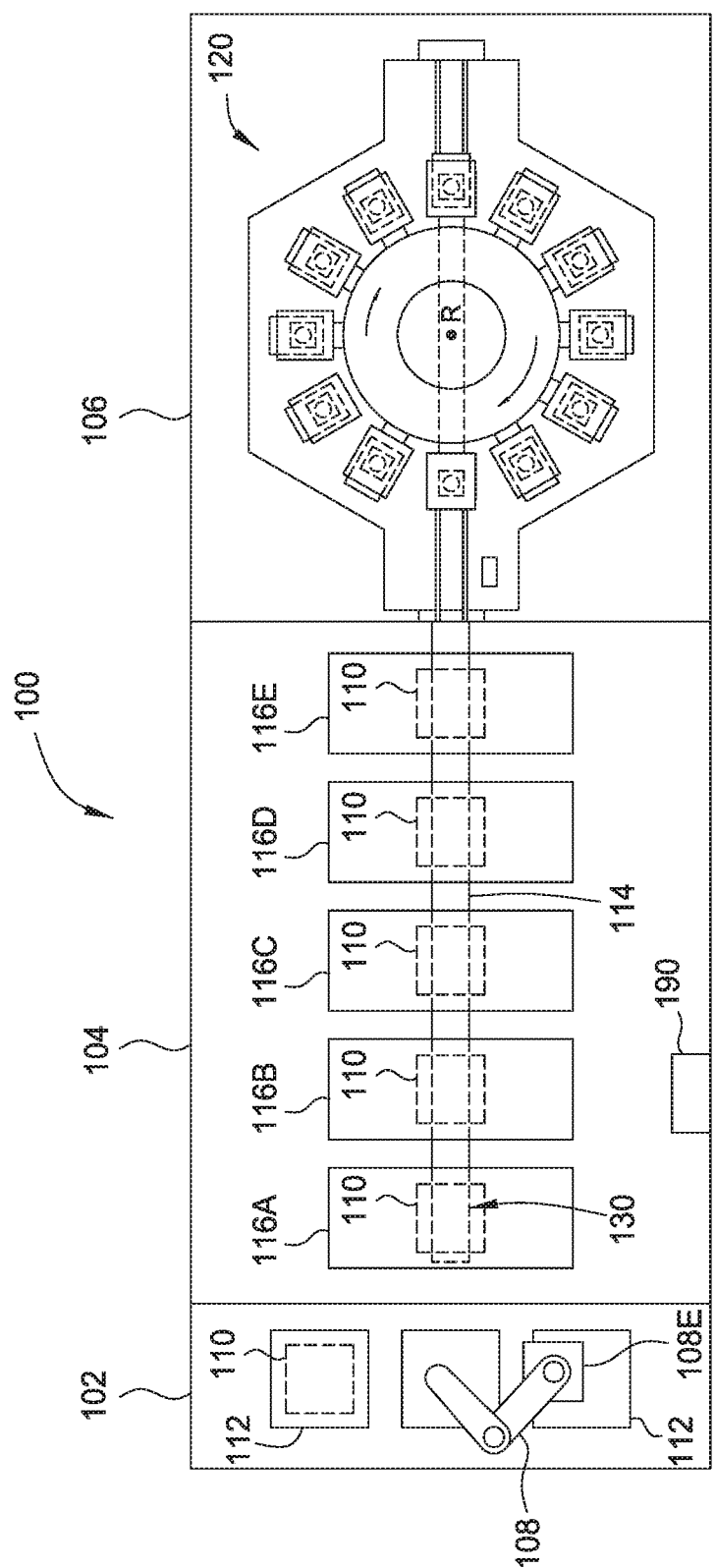
FIG. 1 illustrates a top plan view of an inspection system, according to one embodiment.

FIG. 1 illustrates a top plan view of an inspection system 100, according to one embodiment. The inspection system 100 includes a front end 102, a modular unit 104, and a sorting unit 106. The front end 102 may be, for example, a loading unit. The modular unit 104 may be, for example, a metrology unit. The sorting unit 106 may be, for example a sorting module. The front end 102, the module unit 104, and the sorting unit 106 may be, by way of example only, disposed linearly relative to another. The front end 102 includes a transfer robot 108 having support elements 108E, such as a suction element, end effector, and gripper clamp for gripping and transferring substrates 110. The transfer robot 108 is adapted to transfer substrates 110 from one or more cassettes 112 positioned within the front end 102 to a conveyor system 114. The conveyor system 114 may be a motor-driven conveyor system and may include one or more conveyors, such as transportation belts or tracks driven by an actuator through rollers and/or drive gears. The conveyor system 114 may be disposed in a linear arrangement to transfer substrates received from the transfer robot 108 through the modular unit 104. As such, the conveyor system 114 is disposed within the modular unit 104 and facilitates the transfer of substrates 110 through the modular unit 104. Additional modular units may be positioned between the front end 102 and the modular unit 104, and/or between the modular unit 104 and the sorting unit 106, and/or following the sorting unit 106 to facilitate expansion of the inspection system 100.

The front end 102 receives one or more cassettes 112. Each cassette 112 may contain substrates 110 in a stacked configuration. The substrates may be stacked, for example, horizontally or vertically. For example, each cassette 112 may include a plurality of slots therein, and each slot is configured to hold a substrate 110. By continued example, the cassette 112 may be positioned such that the substrates 110 are positioned one over another. The substrates 110 are transferred from the cassettes 112 via a transfer robot 108 to the conveyor system 114 for transfer through the system 100. The front end 102 includes a computer (not shown) having a graphical user interface adapted to present information related to operations occurring in the front end 102, including processing metrics, lot numbers, and the like. In one example, the computer may include a touch screen interface.

The modular unit 104 may include one or more metrology stations. In the embodiment of FIG. 1, the modular unit 104 includes five metrology stations 116A-116E. It is contemplated that the inspection system 100 may also be modified by adding or subtracting metrology stations to the modular unit 104, as space permits, rather than adding a second modular unit, thus increasing throughput and/or the number of metrology processes performed.

The metrology stations may include, by way of example only, any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit may be, by way of example only, configured to inspect substrates for cracks, as well as to optionally determine crystal fraction of a substrate. The geometry inspection unit may be configured, by way of example only, to analyze surface properties of a substrate. The saw mark detection unit may be configured, by way of example only, to identify saw marks including groove, step, and double step marks on a substrate. The metrology stations may also include other examples beyond those listed above.

By further example and for purposes of illustration only, the metrology station 116B may be a thickness measuring unit adapted to measure substrate thickness. Metrology station 116B may also, or alternatively, measure resistivity of a substrate 110. The metrology station 116B receives substrates 110 transferred along the conveyor system 114 subsequent to inspection in the metrology station 116A, which may be any type of metrology station. The metrology station 116B is disposed along the in-line path of the substrates 110 defined by the conveyor system 114 downstream of the location of the metrology station 116A. The metrology station 116B performs one or more inspection processes on a substrate 110. The inspection process occurring at metrology station 116B may be performed while the substrate is in motion; however, it is contemplated that the motion of the substrate 110 may be stopped to facilitate increased accuracy of inspection.

By further example and for purposes of illustration only, the metrology station 116C may be a photoluminescence unit configured to detect defects and/or perform impurity measurements, and metrology station 116D may be a geometry inspection unit configured to analyze the geometry and surface properties of the substrate 110.

Metrology station 116C receives substrates 110 transferred along the conveyor system 114 subsequent to the inspection thereof in the metrology station 116B. Metrology station 116D receives substrates 110 transferred along the conveyor system 114 subsequent to the inspection thereof in the metrology station 116C. Metrology station 116E receives substrates 110 transferred along the conveyor system 114 subsequent to the inspection thereof in the metrology station 116D, and so forth if additional metrology units are utilized in a linear path as shown. Additionally, in some embodiments, non-linear path inspection may be utilized. As such, substrates 110 may be transferred between metrology stations 116A-116E in a non-linear fashion, such as in a circular fashion or in an arcuate fashion.

The conveyor system 114 conveys the inspected substrates 110 from the modular unit 104 towards the sorting unit 106. The conveyor system 114 may deliver inspected substrates 110 into the sorting unit 106 to a location within reach of a rotary sorting system 120 housed with sorting unit 106. Additionally, the conveyor system 114 may continue through the sorting unit 106 to a connector 150. As such, if the sorting unit 106 is not sorting substrates 110 an inspected substrate 110 may bypass the rotary sorting system 120 of the sorting unit 106. Furthermore, if an inspected substrate 110 is not picked up by the rotary sorting system 120 the substrate may continue along the conveyor system 114 toward the connector 150. In certain embodiments, substrates not picked up by the rotary sorting system 120 may continue along the conveyor system 114 which may lead to a non-sorted substrate bin. In certain embodiments the sorting unit 106 may be further connected with additional units such as, by way of example only, additional inspection systems, additional sorting units, additional metrology units, etc. via the connector 150. The connector 150 may further allow the conveyor system 114 to align with a conveyor system of an additional unit such as, by way of example only, an additional inspection system, an additional sorting unit, an additional metrology units, etc.

The inspection system 100 may also include a controller 190. The controller facilitates the control and automation of the system 100. The controller 190 may be coupled to or in communication with one or more of the conveyor system 114, the front end 102, the modular unit 104, the sorting unit 106, the transfer robot 108, and/or the metrology stations 116A-116E. The inspection system 100 may provide information to the controller 190 regarding substrate movement, substrate transferring, substrate sorting, and/or metrology performed.

The controller 190 may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position or location). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller 190 determines which tasks are performable on a substrate. The program may be software readable by the controller 190 and may include code to monitor and control, for example, the processing time and substrate position or location within the inspection system 100.

Figure 2:
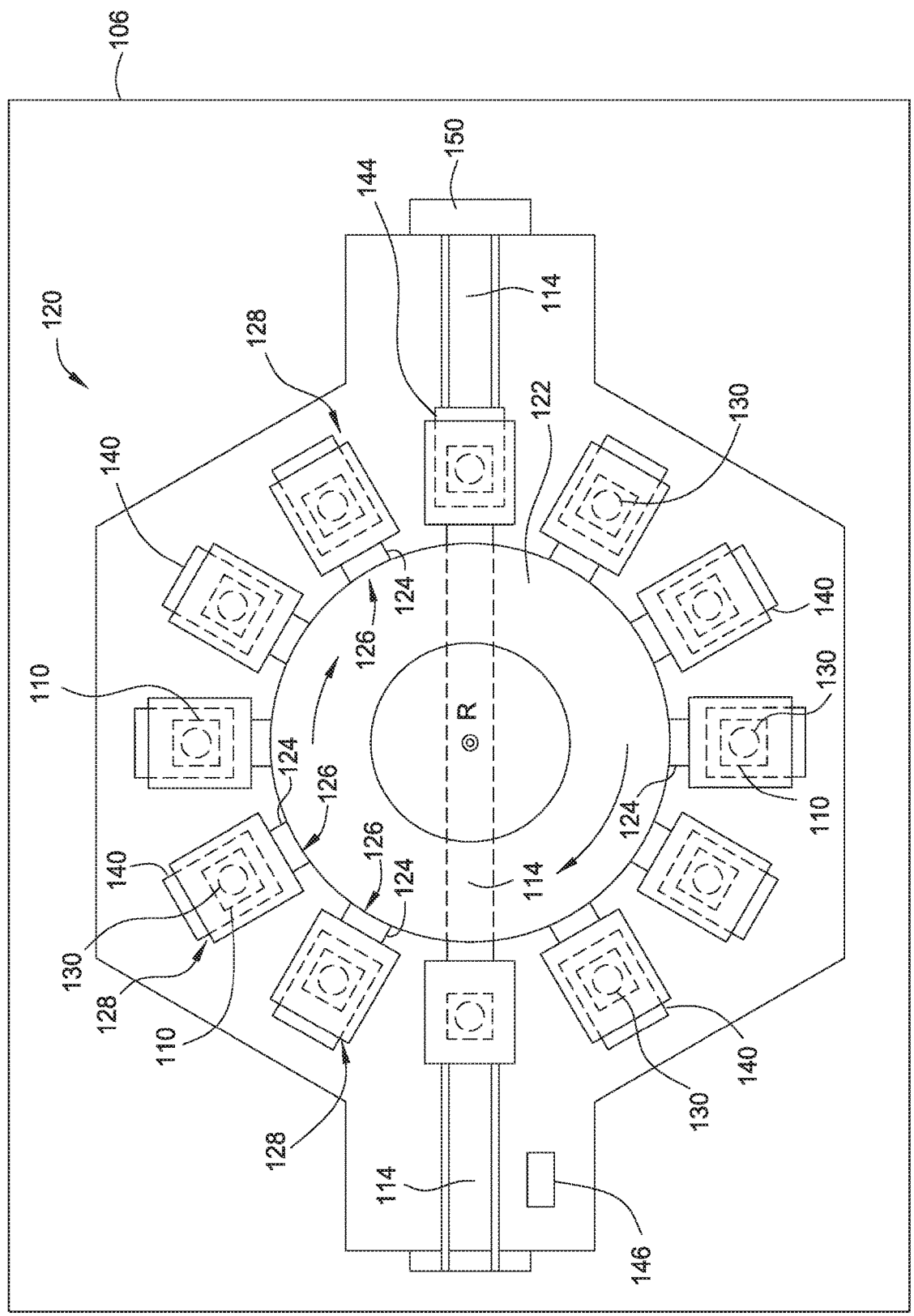
FIG. 2 illustrates a top plan view of the high speed rotary sorter of the inspection system of FIG. 1, according to one embodiment.

FIG. 2 illustrates a top plan view of the rotary sorting system 120 of FIG. 1 housed within the sorting unit 106. The rotary sorting system 120 includes a rotatable support 122 contained within the rotary sorting system 120. The rotatable support 122 has a rotational axis R. The rotatable support 122 may be a rotary disc, a circular support, or any other shape for efficiently sorting substrates 110. The rotatable support 122 includes a plurality of arms 124. Each arm 124 has a first end 126 and a second end 128. The first end 126 of each arm 124 is coupled to the rotatable support 122 via a suitable connection, such as, for example, a welded connection, a pinned connection, a fastened connection, etc. The second end 128 of each arm 124 extends radially outward relative to the rotational axis R. In one embodiment, the rotatable support 122 may include at least twelve arms 124, such as fourteen arms or sixteen arms; however it is contemplated that any number of arms 124 may be utilized, such as, by way of example only, ten or more arms 124.

At least one gripper 130 is coupled to the second end 128 of each arm 124. Each gripper 130 may be disposed on a bottom side or end of each of the arms 124 so that each gripper 130 may grab the substrate 110 once the inspected substrate 110 reaches the sorting unit 106. Each gripper 130 may be, by way of example only, a suction gripper, a claw gripper, a magnetic gripper, or a picker. In one embodiment, each gripper 130 is a Bernoulli picker.

One or more sorting bins 140 are disposed radially outward of the rotational axis R. In one embodiment, by way of example only, at least ten sorting bins 140 are utilized; however it is contemplated that any number of sorting bins 140 may be utilized, such as, for example, six, eight, or twelve sorting bins 140. The sorting bins 140 may be positioned directly below the path taken by the grippers 130 as the plurality of arms 124 are rotated by the rotatable support 122. In one mode of operation, the rotary sorting system 120 may rotate about the rotational axis R in a stepping fashion such that the rotary sorting system 120 stops to grip (i.e., pick up) a substrate 110 from the conveyor system 114 as each substrate 110 enters the sorting unit 106. The sorting bins 140 are positioned to receive substrates 110 from the rotary sorting system 120. The substrates 110 may be sorted into the sorting bins 140 in response to one or more substrate characteristics determined during one or more of the inspection processes performed in the metrology stations 116A-116E. The rotary sorting system 120 positions the substrates 110 over a sorting bin 140 assigned to receive substrates having at least one predefined substrate characteristic. The substrate 110 is then released from the respective gripper(s) 130 into the appropriate sorting bin 140. The sorting bins 140 may store the sorted substrates 110 as released by the grippers 130.

The sorting bins 140 may each be individually removable from the sorting unit 106. Each sorting bin 140 may be removably connected with the sorting unit 106 such as, by way of example only, an individually removable drawer or container, a slide out vessel, or pull out drawer or container. By way of continued example, each sorting bin 140 may be accessible from outside the sorting unit 106 such that each sorting bin 140 may be removed from the sorting unit 106 without entering the sorting unit 106. A full sorting bin 140 may be removed from the sorting unit 106 by, for example, pulling the sorting bin 140 out of the sorting unit 106. Each sorting bin 140 may be removable from the sorting unit 106 while the sorting unit 106 is sorting substrates 110. As such, the sorting of substrates 110 may continue even though a particular sorting bin 140 is full or has been removed. Therefore, each sorting bin 140 may be emptied or replaced while sorting is occurring. Additionally, the controller 190 may count the number of substrates 110 within each sorting bin 140 via the use of a counter (not shown). As such, when a particular sorting bin 140 is full or not in place, the sorting unit 106 skips the full or removed sorting bin 140 until the full or removed sorting bin 140 is emptied or replaced. Once an empty sorting bin 140 has been replaced within the sorting unit 106 the counter may reset for that particular sorting bin 140. The counter may automatically reset each time the sorting bin 140 is replaced or emptied. A full sorting bin 140 may be emptied or replaced by an operator. As such, the sorting unit 106 may continue to rotate a substrate 110 until an assigned sorting bin 140 is available. If no sorting bin 140 is available, the sorting unit 106 may alert the operator and continue to rotate the substrate 110 until an appropriate sorting bin 140 becomes available. Once the controller 190 determines that a particular sorting bin 140 is approaching capacity or is at capacity, the controller 190 may alert the operator by sounding an alarm and/or displaying an alert.

Although not shown, it is contemplated that an additional sorting bins 140 may be positioned within the sorting unit 106 to receive substrates 110 which may inadvertently be omitted from sorting, thus preventing damage to such substrates. While ten sorting bins 140 are shown, it is contemplated that more or less than ten sorting bins 140 may be included within the sorting unit 106, such as six, eight, eighteen, or twenty-four sorting bins 140. Additionally, a rejection bin 144 may be positioned within the sorting unit 106 to capture substrates 110 which have been rejected by one or more of the metrology stations 116A-116E of the modular unit 104. As such, the rotary sorting system 120 may deliver a damaged substrate to the rejection bin 144.

The rotary sorting system 120 may also include a yield analysis server 146 accessible by one or more access panels. The yield analysis server 146 is coupled to one or more of the front end 102 and the metrology stations 116A-116E, and adapted to receive, collect, analyze, store, and/or report data received from the front end 102 and the one or more metrology stations 116A-116E with respect to each substrate 110 passing therethrough.

The rotatable support 122 may be coupled with a rotary actuator (not shown), such as a pneumatic cylinder or stepper motor. The rotary actuator may rotate the rotatable support 122, such as in an indexing fashion. Upon each indexing step of the rotatable support 122 a new substrate 110 is received from the modular unit 104 via the conveyor system 114 onto the rotary sorting system 120 via each gripper 130. Additionally, and as further discussed infra, the rotatable support 122 may index each of the plurality of arms 124 over a respective sorting bin 140 and/or over a rejection bin 144, such that the substrate 110 may be released into the sorting bin 140 or the rejection bin 144. By continually moving, or index stepping, substrates 110 may be continuously removed from the conveyor system 114, thus immediately freeing the space on the conveyor system 114 for the next substrate 110. As such, the rotary motion allows each gripper 130 to interface with each sorting bin 140 so that the substrate held by the grippers 130 will be released into one of the sorting bins 140 prior to the grippers 130 rotating back to a position to receive another substrate 110. The rotary sorting system 120 will continue to move until all substrates 110 have been sorted.

In some embodiments the rotary sorting system 120 may pick up a substrate 110 delivered from the modular unit 104 via the conveyor system 114 every ⅔ of a second. In such embodiments the rotary sorting system 120 may advantageously sort at least 5,400 substrates per hour, which is a significant improvement over conventional sorting systems.

Figure 3:
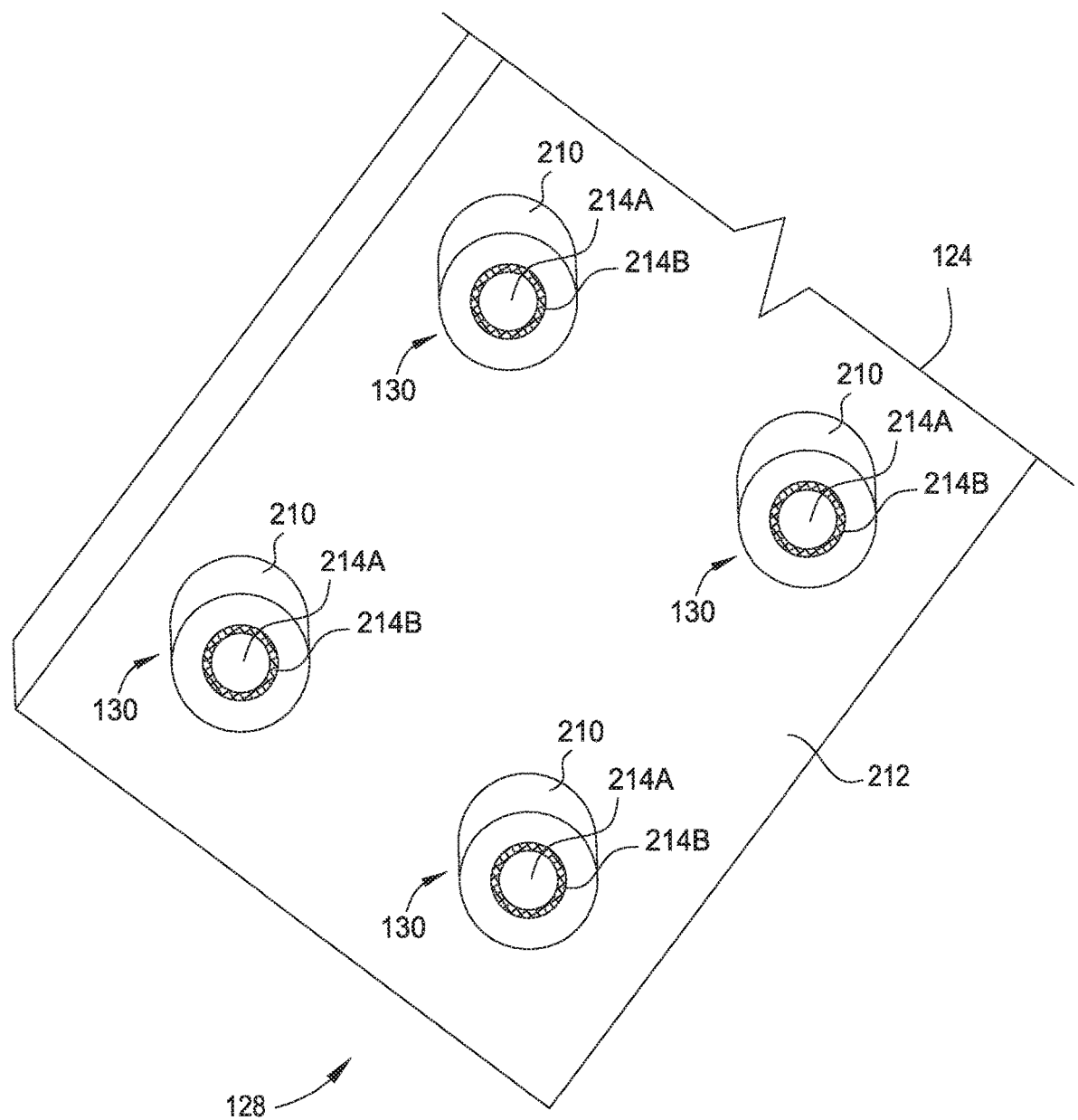
FIG. 3 illustrates a perspective view of at least one Bernoulli picker of the high speed rotary sorter, according to one embodiment.

FIG. 3 illustrates a perspective bottom view of the at least one gripper 130 of the rotary sorting system 120 as connected with one of the plurality of arms 124 of the rotatable support 122. In the embodiment of FIG. 3, four grippers 130 are shown; however it is contemplated that any number of grippers 130 may be utilized. As discussed supra, in one embodiment each gripper 130 may be a Bernoulli picker 210. Four Bernoulli pickers 210 are shown in the embodiment of FIG. 3. Each Bernoulli picker 210 may be operatively connected with each of the plurality of arms 124, with one Bernoulli picker 210 located near each corner of each arm 124. Each Bernoulli picker 210 may extend downward from the arm 124 in order to lift the substrate 110. The location of each Bernoulli picker 210 is dependent upon the number of Bernoulli pickers utilized. In one embodiment, only one Bernoulli picker 210 may be utilized per arm 124, and as such, it is contemplated that the Bernoulli picker 210 may be centrally located on each arm 124 and near the second end 128 of each arm 124. Furthermore, each Bernoulli picker 210 may be disposed on a bottom side 212 of each of the plurality of arms 124 such that each Bernoulli picker 210 is capable of transferring a substrate 110 from the conveyor system 114 of the modular unit 104 about the sorting unit 106 and into the appropriate sorting bin 140 or rejection bin 144.

Each Bernoulli picker 210 may be suited for lifting applications which call for sensitive handling, such as the handling of a substrate 110. Each Bernoulli picker 210 may operate to provide a soft-contact transfer or a non-contact transfer of the substrate 110 by applying airflow between a non-contact surface 214A of the Bernoulli picker 210 and the substrate 110. The airflow from the non-contact surface 214A may create vacuum and lift forces on a surface of the substrate 110. A stop 214B may be located between the non-contact surface 214A of the Bernoulli picker and the substrate 110. The stop 214B may prevent the substrate 110 from sliding or moving off of the Bernoulli picker 210 as the substrate is sorted. The stop 214B may be a soft surface which may make contact with the substrate 110; however the stop 214B may be an intermediary between the non-contact surface 214A providing vacuum and lift forces and the substrate 110 such as to prevent damage to the substrate 110. The stop 214B may be a thin material, such as a material which may not damage the substrate 110. The stop 214B may prevent contact of the substrate 110 with the non-contact surface 214A of the Bernoulli picker 210. Due to the vacuum force and the continuous flow occurring from the non-contact surface 214A of the Bernoulli picker 210 and the substrate 110, the substrate 110 does not contact the Bernoulli picker 210 directly, but rather may contact the stop 214B, thus enabling the safe handling of the substrate 110 within the sorting unit 106. Advantages of the use of the Bernoulli picker 210 include the contactless picking of substrates 110 due to air streaming between the non-contact surface 214A and the surface of the substrate 110.

Figure 4:
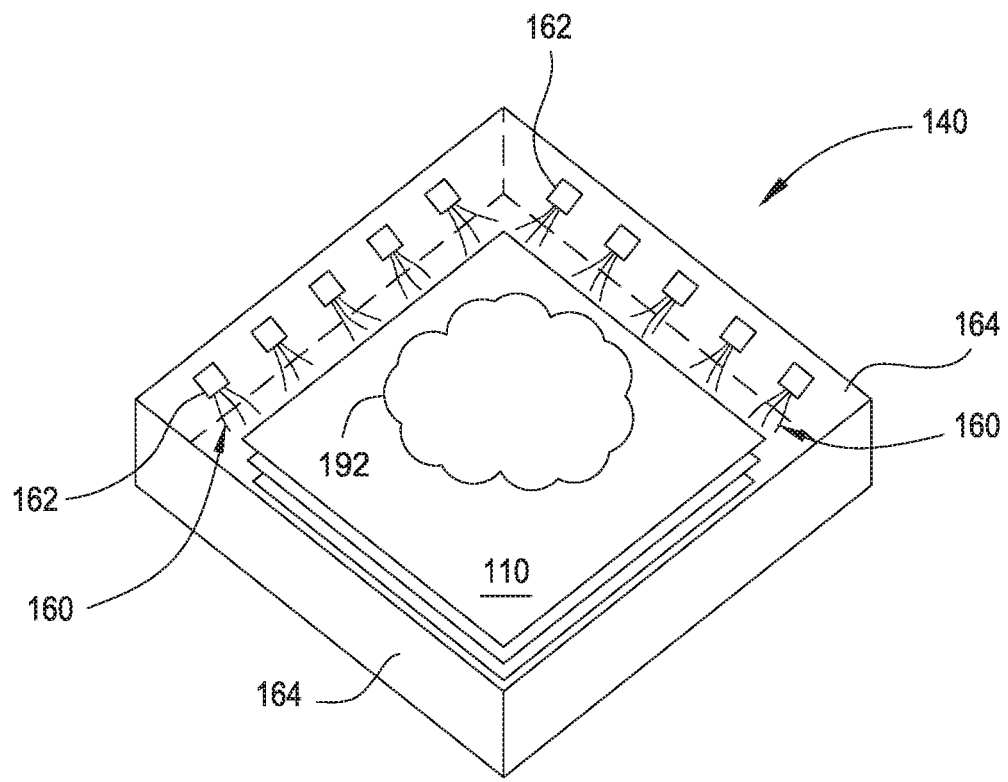
FIG. 4 illustrates a top plan view of a sorting bin, according to one embodiment.

FIG. 4 illustrates a top view of a sorting bin 140, according to one embodiment. The rejection bin 144 may be similarly construed. As discussed supra, each substrate 110 is sorted into a sorting bin 140 or a rejection bin 144 based upon the inspection data obtained in one or more of the metrology stations 116A-116E. The yield analysis server 146 analyzes received inspection data and determines a particular sorting bin 140 or rejection bin 144 in which the substrate 110 is to be sorted. The sorting bins 140 and the rejection bins 144 may be identical; however, each may serve a separate and distinct purpose. As the substrate is positioned over the appropriate bin, the rotary sorting system 120 may momentarily stop to pick up a new substrate 110. During the stop, any substrate 110 which is positioned over the appropriate sorting bin 140 may be released from the respective gripper 130 such that the substrate is dropped into the sorting bin 140. Immediately prior to release the substrate 110 is substantially parallel to the sorting bin such that the substrate 110, upon release, encounters an air pillow 192, or resistance, which slows the fall of the substrate 110. The air pillow 192 may provide resistance to a falling substrate 110 such that the substrate 110 gently falls into the sorting bin 140.

As further illustrated in FIG. 4, in certain embodiments, each sorting bin 140 may optionally include a plurality of gas outlets 162. The gas outlets 162 are oriented to provide an additional gas support cushion 160 within the sorting bin 140. The gas support cushion 160 may allow for each substrate 110 released by the gripper 130 to gently fall into the sorting bin 140 due to a gas leaked into the sorting bin 140, such as air, which dampens the fall and protects the substrate 110 from cracking, breaking, or other damage. The optional gas support outlets 162 may release a pressurized gas, such as air, oxygen, or any other suitable pressurized or non-pressurized gas. The gas outlets 162 may be located on the walls 164 of each sorting bin 140 and/or the rejection bin 144. In one embodiment, gas may optionally be fed into the gas outlets 162 by a supply line connected with a gas supply (not shown). In another embodiment, gas may be fed through the gas outlets 162 by a gas source which is not in direct connection with the sorting bin 140. The amount of gas supply may be controlled by the controller 190.

Figure 5:
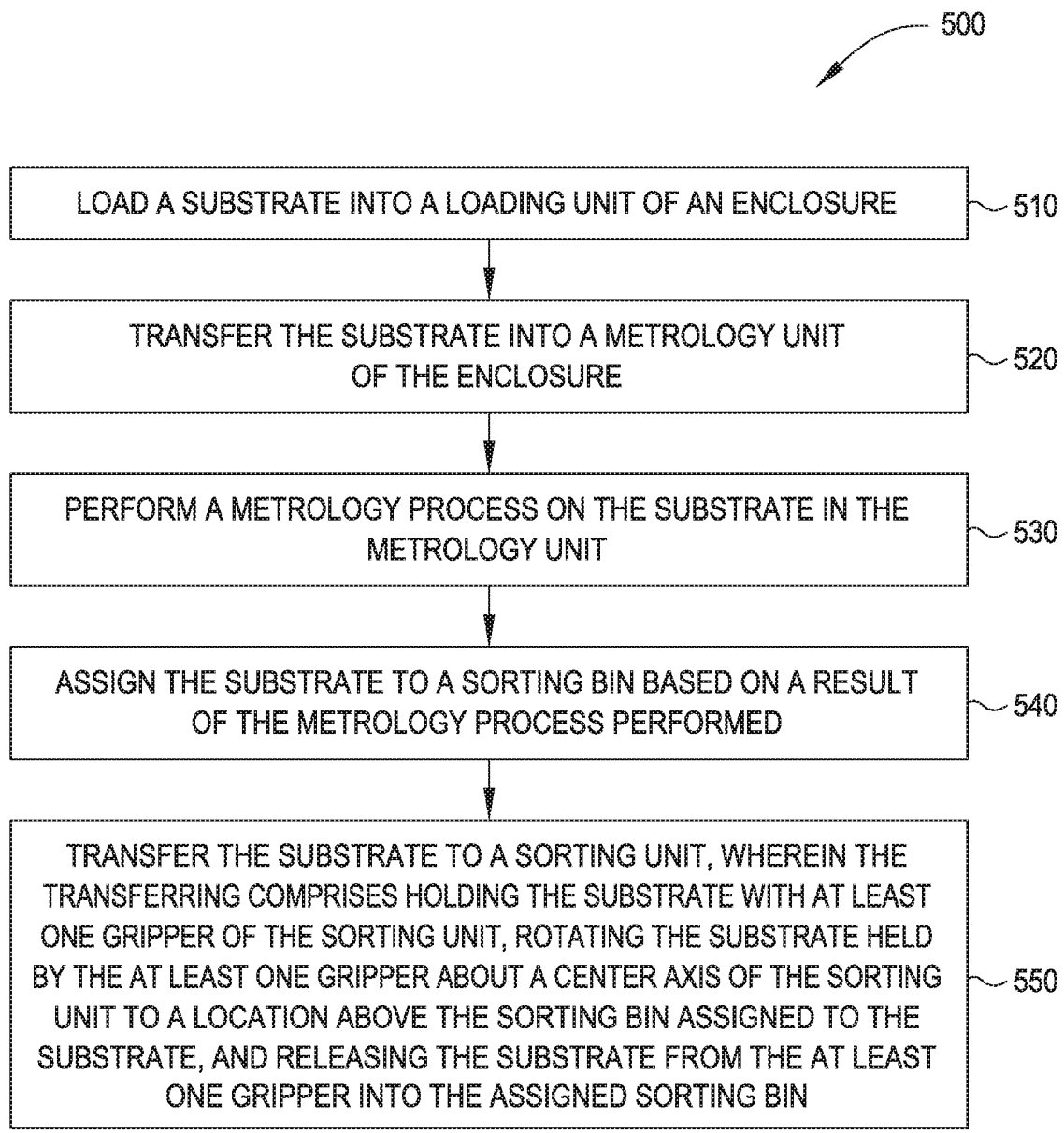
FIG. 5 illustrates a flow diagram of a method for sorting substrates, according to one embodiment.

FIG. 5 illustrates a flow diagram 500 of a method for inspecting and sorting a plurality of substrates, according to one embodiment. Flow diagram 500 begins at operation 510, in which a substrate is loaded into a front end, such as a loading module, of the inspection system 100. In order to load the substrate into the front end, a cassette carrying a plurality of substrates for inspection may be positioned at a loading station of the front end, such as front end 102 of the inspection system 100. At operation 520, the substrate is transferred into a modular unit, such as a metrology module, of the inspection system 100. A robot located within the modular unit may remove the substrate from the cassette and position the substrate on a conveyor system, such as conveyor system 114. As the conveyor system moves through the inspection system 100, the conveyor system 114 transfers the substrate through each of the metrology units disposed along the conveyor system 114 within the modular unit 104.

At operation 530, metrology is performed on the substrate in the modular unit 104. The substrate may be inspected by a first metrology station, such as metrology station 116A. By way of example only, the metrology station 116A may be a micro-crack inspection unit, a thickness measuring unit, a resistivity measuring unit, a photoluminescence unit, a geometry inspection unit, or a saw mark detection unit. The metrology station 116A may perform one or more operations on the substrate as the substrate is moved relative thereto, and then forward inspection data to a yield analysis server 146. The conveyor system 114 may continue to move the substrate through the modular unit and the various other metrology units contained therein, such as metrology stations 116B-116E. Any number of metrology units may be comprised along the conveyor system 114 within the modular unit 104.

At operation 540 the substrate may be assigned to a sorting bin based on the results or determinations made within the various metrology units. The data and results from the various metrology units may be sent to a yield analysis server which may comprise and analyze the data and inspection results to determine which substrate belongs in which sorting bin. To illustrate, by way of example only, as described supra, metrology station 116A may be a micro-crack inspection unit. If metrology station 116A inspects a substrate and determines that the substrate contains one or more micro-cracks, such data may be sent to the yield analysis server. The yield analysis server may then determine that due to the micro-cracks, that particular substrate must be assigned to, for example, sorting bin D. For purposes of illustration only, sorting bin D may be a sorting bin in which the substrates contained therein are re-melted.

At operation 550 the substrate is transferred to a sorting module. To facilitate the transferring the substrate may be coupled with at least one gripper of the sorting module, and subsequently rotated about the center axis of the sorting module until a desired location above the appropriate sorting bin is reached. The appropriate sorting bin is based upon the results and inspection data as determined by the yield analysis server and obtained in one or more of operations 510-540. The yield analysis server analyzes received inspection data and determined a particular bin in which the substrate is to be sorted. As the substrate reaches the position above the appropriate sorting bin, the substrate may be released from the at least one gripper such that the substrate may fall into the sorting bin. After the release of the substrate by the at least one gripper, the substrate may be supported with an air pillow 192 as the substrate is released above the sorting bin. The air pillow 192 may prevent the substrate from damaging. In certain embodiments, the substrate 110 may optionally be supported with a gas cushion. The gas may be air or any other suitable gas for supporting a substrate. Furthermore, the gas or air may be pressurized. Operation 550 may be repeated until each substrate inspected within the inspection system has been sorted into the appropriate bin.

The substrate sorting system disclosed provides for the sorting of substrates into appropriate sorting bins based on metrology inspection data received. The inspection system disclosed is expandable and may be used to detect a variety of substrate deficiencies prior to processing. The system may sort the inspected substrates received from the metrology unit using a rotary sorter coupled with at least one gripper, such as a Bernoulli picker. As a gripper picks up each substrate space on the conveyor from the metrology unit is immediately freed, thus allowing for the next substrate to be transported via the conveyor toward the sorting module. During this time the next substrate moves along the conveyor, the rotary sorter steps about the rotational axis of the rotary sorter with the picked substrates to the next location, and the following gripper is in place to receive the next substrate. The rotary sorter with the picked substrates continues to step about the rotational axis of the rotary sorter until the appropriate gripper has reached a location above the selected sorting bin. Once each gripper has reached the location above the selected sorting bin the gripper will release, or drop, the substrate into the sorting bin. The substrate will fall gently into the sorting bin due to an air pillow, or air resistance between the falling substrate and the sorting bin. Optionally, a gas, such as air, may be provided under the falling substrate which may further dampen the fall of the substrate, thus preventing any additional damage to the substrate.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. An apparatus for inspecting and sorting a plurality of substrates, the apparatus comprising:
    a sorting unit;
    a rotatable support disposed within the sorting unit, the rotatable support rotatable about a rotational axis;
    a plurality of arms, each arm having a first end coupled to the rotatable support and a second end extending radially outward from the rotatable support relative to the rotational axis;
    at least one gripper coupled to the second end of each arm; and
    a plurality of bins positioned within the sorting unit below a path along which the at least one gripper travels as the rotatable support rotates, wherein the bins are respectively associated with predefined substrate characteristics, and wherein the sorting unit is configured to sort the plurality of substrates into the plurality of bins according to substrate characteristics determined by testing the substrates, wherein the sorting unit is configured to release a first substrate of the plurality of substrates into a first bin of the plurality of bins associated with the substrate characteristics of the first substrate, wherein the sorting unit is configured to continue to rotate the first substrate when no bins of the plurality of bins disposed below the path are available to receive the first substrate until a bin associated with the tested substrate characteristics of the first substrate becomes available below the path, wherein the plurality of bins comprise a plurality of gas outlets operable to generate a gas support cushion within the plurality of bins.

2. The apparatus of claim 1, wherein the at least one gripper is a Bernoulli picker.

3. The apparatus of claim 1, wherein the at least one gripper is a contactless gripper.

4. The apparatus of claim 1, further comprising a loading unit coupled with a metrology unit, wherein the metrology unit is coupled with the sorting unit.

5. The apparatus of claim 1, wherein the plurality of bins are positioned to receive substrates released by the at least one gripper.

6. The apparatus of claim 1, wherein the plurality of bins are individually removable from outside the sorting unit, and wherein the plurality of bins may be individually removed while sorting is occurring.

7. The apparatus of claim 1, further comprising a controller, wherein the controller comprises a computer-readable medium storing instructions that, when executed by a processor, cause the controller to sort the plurality of substrates, by performing the steps of:
holding the substrate with at least one gripper of the sorting module;
rotating the substrate held by the at least one gripper about a center axis of the sorting unit to a location above the sorting bin assigned to the substrate; and
releasing the substrate from the at least one gripper into the assigned sorting bin.

8. An apparatus for inspecting and sorting a plurality of substrates, the apparatus comprising:
a sorting unit;
a rotatable support disposed within the sorting unit, the rotatable support rotatable about a rotational axis;
a plurality of arms, each arm having a first end coupled to the rotatable support and a second end extending radially outward from the rotatable support relative to the rotational axis;
at least one gripper coupled to the second end of each arm; and
a plurality of bins positioned within the sorting unit below a path along which the at least one gripper travels as the rotatable support rotates, wherein at least one bin of the plurality of bins comprises a plurality of gas outlets operable to generate a gas support cushion within the at least one bin.

9. An apparatus adapted to inspect and sort a plurality of substrates, comprising:
a loading unit;
a metrology unit coupled with the loading unit; and
a sorting unit coupled with the metrology unit, wherein the sorting unit comprises:
a plurality of arms extending radially outward from an axis of rotation;
at least one gripper coupled to and end of each arm; and
a plurality of individually removable sorting bins positioned within the sorting unit, below a path along which the at least one gripper travels as the at least one gripper rotates, wherein the individually removable sorting bins are respectively associated with predefined substrate characteristics, and wherein the sorting unit is configured to sort the plurality of substrates into the plurality of individually removable sorting bins according to substrate characteristics determined by testing the substrates in the metrology unit, wherein the sorting unit is configured to release a first substrate of the plurality of substrates into a first bin of the plurality of individually removable sorting bins associated with the substrate characteristics of the first substrate, wherein the sorting unit is configured to continue to rotate the first substrate when no bins of the plurality of individually removable sorting bins disposed below the path are available to receive the first substrate until a bin associated with the tested substrate characteristics of the first substrate becomes available below the path, wherein at least one bin of the plurality of individually removable sorting bins comprises a plurality of gas outlets operable to generate a gas support cushion within the at least one bin.

10. The apparatus of claim 9, further comprising a controller, wherein the controller comprises a computer-readable medium storing instructions that, when executed by a processor, cause the controller to sort the substrates, by performing the steps of:
holding the substrate with at least one gripper of the sorting module;
rotating the substrate held by the at least one gripper about a center axis of the sorting unit to a location above the sorting bin assigned to the substrate; and
releasing the substrate from the at least one gripper into the assigned sorting bin.

11. The apparatus of claim 9, wherein the at least one gripper is a Bernoulli picker.

12. The apparatus of claim 9, wherein the at least one gripper is a contactless gripper.

13. The apparatus of claim 9, wherein the plurality of individually removable sorting bins are positioned to receive substrates released by the at least one gripper.

14. The apparatus of claim 9, wherein each of the plurality of individually removable sorting bins are removable from outside the sorting unit.

15. An apparatus adapted to inspect and sort substrates, comprising:
a loading unit;
a metrology unit coupled with the loading unit; and
a sorting unit coupled with the metrology unit, wherein the sorting unit comprises:
a plurality of arms extending radially outward from an axis of rotation;
at least one gripper coupled to and end of each arm; and
a plurality of individually removable sorting bins positioned within the sorting unit, below a path along which the at least one gripper travels as the at least one gripper rotates, wherein each individually removable sorting bin comprises a plurality of gas outlets operable to generate a pressurized gas support cushion within the individually removable sorting bin.

16. A method of operating an apparatus for inspecting and sorting a plurality of substrates in an enclosure, the method comprising:
loading a substrate into a loading unit of the enclosure;
transferring the substrate into a metrology unit of the enclosure;
performing a metrology process on the substrate in the metrology unit;
assigning the substrate to a sorting bin based on a result of the metrology process performed; and
transferring the substrate to a sorting unit, wherein in the transferring comprises:
holding the substrate with at least one gripper of the sorting unit;
rotating the substrate held by the at least one gripper about a center axis of the sorting unit to a location above the sorting bin assigned to the substrate;
releasing the substrate from the at least one gripper into the assigned sorting bin when a bin associated with the tested substrate characteristics of a first substrate of the plurality of substrates becomes available below the path; and
flowing gas into the bin to cushion the substrate.

17. A method of operating an apparatus for inspecting and sorting a plurality of substrates in an enclosure, the method comprising:
- loading a substrate into a loading unit of the enclosure;
- transferring the substrate into a metrology unit of the enclosure;
- performing a metrology process on the substrate in the metrology unit;
- assigning the substrate to a sorting bin based on a result of the metrology process performed; and
- transferring the substrate to a sorting unit, wherein in the transferring comprises:
  - holding the substrate with at least one gripper of the sorting unit;
  - rotating the substrate held by the at least one gripper about a center axis of the sorting unit to a location above the sorting bin assigned to the substrate; and
  - releasing the substrate from the at least one gripper into the assigned sorting bin, wherein the transferring the substrate to the assigned sorting bin further comprises flowing gas into the bin to cushion the substrate.

18. The apparatus of claim 14, wherein each of the plurality of individually removable sorting bins are removable while sorting is occurring.

19. The method of claim 16, wherein the at least one gripper is a Bernoulli picker.

20. The method of claim 16, wherein the at least one gripper is a contactless gripper.

21. The method of claim 16, wherein the assigned sorting bin may be removed while sorting is occurring.

22. The method of claim 21, wherein the assigned sorting bin is removable from outside the sorting unit.

* * * * *